(12) United States Patent
Biegert

(10) Patent No.: US 9,476,398 B2
(45) Date of Patent: Oct. 25, 2016

(54) CONTROL DEVICE FOR A VEHICLE

(71) Applicant: MAGNA ELECTRONICS INC., Auburn Hills, MI (US)

(72) Inventor: Ralf Biegert, Lauchringen (DE)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 180 days.

(21) Appl. No.: 14/290,026

(22) Filed: May 29, 2014

(65) Prior Publication Data
US 2014/0355162 A1    Dec. 4, 2014

Related U.S. Application Data

(60) Provisional application No. 61/830,377, filed on Jun. 3, 2013.

(51) Int. Cl.
| | |
|---|---|
| *H02H 5/04* | (2006.01) |
| *F02P 19/02* | (2006.01) |
| *F02B 3/06* | (2006.01) |
| *H01H 37/76* | (2006.01) |
| *B23K 1/018* | (2006.01) |
| *H05K 13/04* | (2006.01) |
| *H01H 9/16* | (2006.01) |

(52) U.S. Cl.
CPC ............... *F02P 19/027* (2013.01); *F02B 3/06* (2013.01); *H01H 37/761* (2013.01); *H02H 5/047* (2013.01); *B23K 1/018* (2013.01); *H01H 9/167* (2013.01); *H01H 2037/762* (2013.01); *H01H 2037/763* (2013.01); *H05K 13/0486* (2013.01); *H05K 2201/10636* (2013.01)

(58) Field of Classification Search
USPC .................................................. 361/103, 106
See application file for complete search history.

(56) References Cited

U.S. PATENT DOCUMENTS

| | | | |
|---|---|---|---|
| 5,612,662 A | 3/1997 | Drekmeier et al. | |
| 5,896,080 A | 4/1999 | Chen | |
| 6,175,480 B1 | 1/2001 | Karmazyn | |
| 2005/0173394 A1* | 8/2005 | Bohlender | H01H 37/76 219/202 |

(Continued)

FOREIGN PATENT DOCUMENTS

| | | |
|---|---|---|
| DE | 2058357 | 11/1970 |
| DE | 7520602 | 10/1975 |
| DE | 3930819 | 3/1991 |

(Continued)

OTHER PUBLICATIONS

Extended European Search Report dated Sep. 24, 2014 for corresponding European Application No. 1470864.

*Primary Examiner* — Danny Nguyen
(74) *Attorney, Agent, or Firm* — Gardner, Linn, Burkhart & Flory, LLP

(57) ABSTRACT

A control device suitable for use in a vehicle includes a circuit board and a spring element. The circuit board includes a circuit element electrically connected thereat. The spring element is engaged with the circuit element and biased or urged towards the circuit element to exert a force at the circuit element in a direction generally parallel to a surface of the circuit board. The circuit element is electrically connected at the circuit board via a solder joint. When a temperature at the solder joint exceeds a threshold temperature, the spring element moves the circuit element along the surface of the circuit board to break the electrical connection at the solder joint.

19 Claims, 17 Drawing Sheets

(56) References Cited

U.S. PATENT DOCUMENTS

| | | | |
|---|---|---|---|
| 2011/0050386 A1* | 3/2011 | Schlenker | H01H 37/761 337/407 |
| 2013/0298866 A1 | 11/2013 | Vogelbacher | |

FOREIGN PATENT DOCUMENTS

| DE | 4219554 | 12/1993 |
|---|---|---|
| DE | 4437122 | 4/1996 |
| DE | 19639427 | 3/1997 |
| DE | 19647035 | 11/1997 |
| DE | 10044081 | 4/2002 |
| DE | 10102235 | 8/2002 |
| DE | 102004014660 | 7/2005 |
| DE | 102005005549 | 8/2006 |
| DE | 102005014601 | 10/2006 |
| DE | 102006026406 | 12/2007 |
| DE | 102007035899 | 2/2009 |
| DE | 102008011226 | 8/2009 |
| DE | 102008057166 | 5/2010 |
| DE | 102008053182 | 7/2010 |
| DE | 102009036578 | 9/2010 |
| DE | 102011118724 | 5/2013 |
| EP | 1334505 | 8/2003 |
| EP | 1467603 | 10/2004 |
| EP | 1560242 | 8/2005 |
| EP | 2485355 | 8/2012 |
| FR | 2978324 | 1/2013 |
| WO | WO04002202 | 12/2003 |
| WO | WO2010112389 | 10/2010 |

* cited by examiner

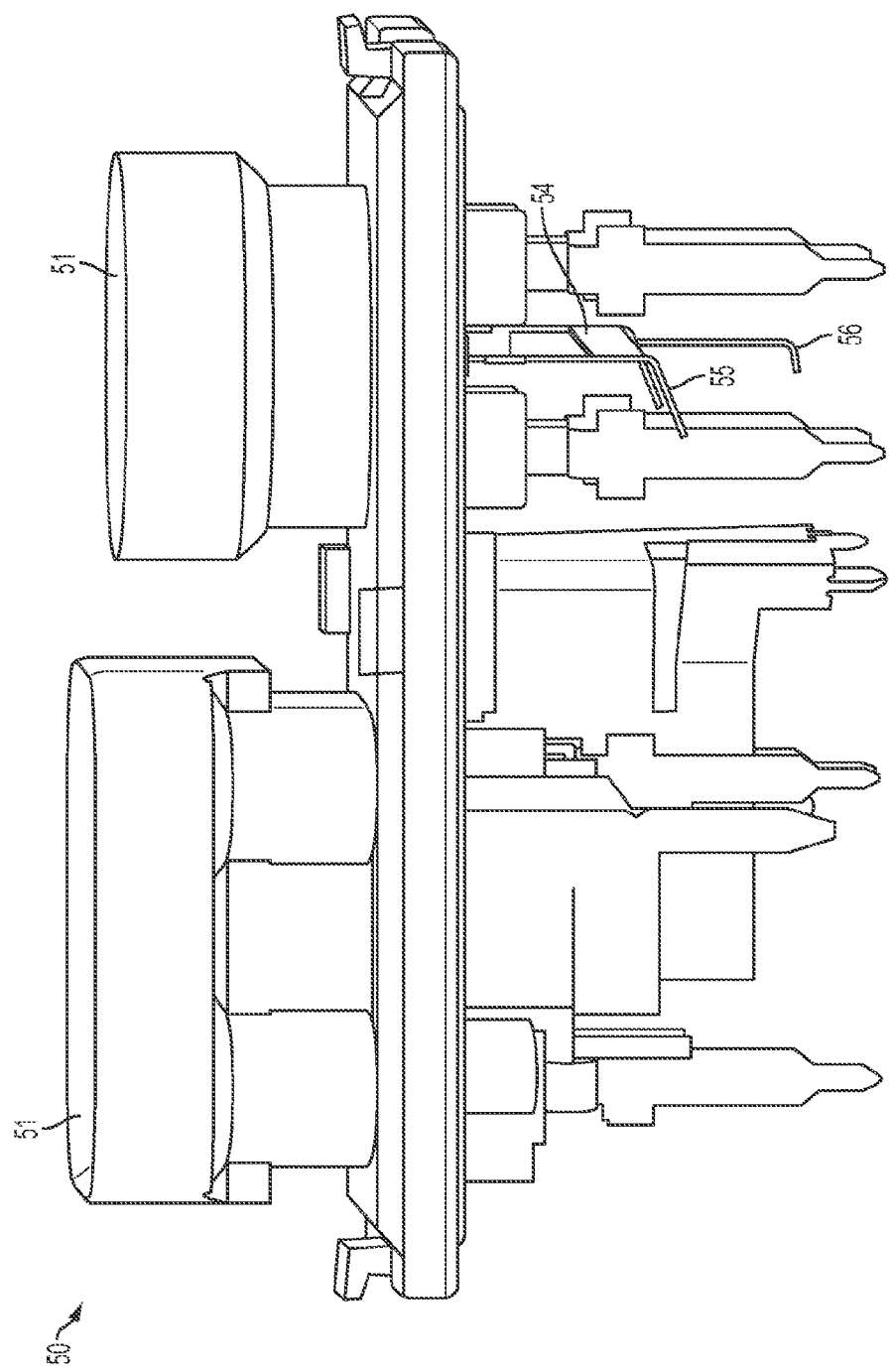

Schematic
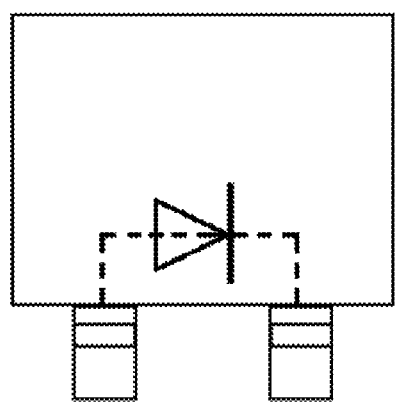
Footprint
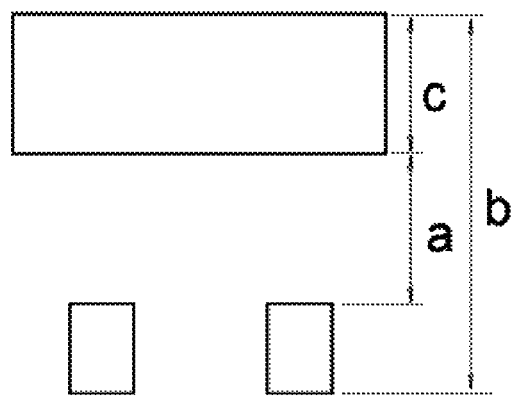
FIG. 14A

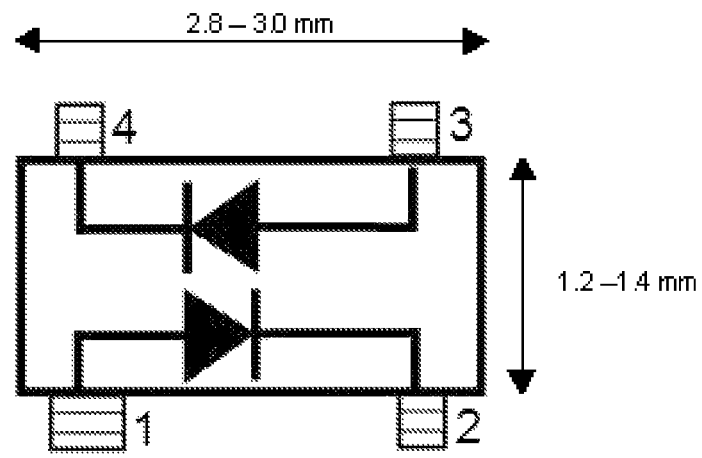
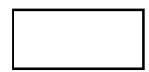 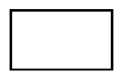
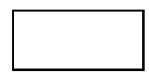 
FIG. 14B

CONTROL DEVICE FOR A VEHICLE

CROSS REFERENCE TO RELATED APPLICATION

The present application claims the filing benefits of U.S. provisional application, Ser. No. 61/830,377, filed Jun. 3, 2013, which is hereby incorporated herein by reference in its entirety.

FIELD OF THE INVENTION

The present invention relates to control devices and, more particularly, to controls or control devices for controlling glow plugs for diesel engines.

BACKGROUND OF THE INVENTION

Glow plugs are known and are used to pre-heat diesel combustion engine cylinders before starting the engine, particularly when the diesel engine is cold. Devices for glow plug control devices are widely known in automotive applications. The controllers typically switch and control the current through glow plugs. The switched/controlled currents are comparably high. In cases where the metal-oxide-semiconductor field-effect transistors (MOS-FETs) become defective, there is the hazard that the glow plug current flow may not become turned off, and may continue to heat, which may lead to damage to the glow plug due to overheating or may lead to defects/slewing of power cables or discharged batteries.

To have a redundant instance to the MOS-FETs, fuses in the line of power are often implemented. Typically, one time fuses use bi-metals or the like and might be known but uncommon for that job. Solutions are known where the main power line becomes broke by one single fuse. Other solutions show power line bundles or one single fuse for each power line, which typically equates to the number of the cylinders of the engine.

SUMMARY OF THE INVENTION

The present invention provides a control device or control with a spring element that functions as a thermal protection device or system for the control device. The spring element is loaded or pre-loaded at the time of inserting the circuit into the housing, whereby the spring element is biased towards or urged towards a circuit element or SMD element at the circuit board. The spring itself is not the conductor but the springs force is applied to the SMD element, which is pushed and moved away from the conductors on the circuit board when the solder heats to a point where the solder is weakened and thus is becoming fluid, thereby breaking the solder joint and stopping current flow through the circuitry of the circuit element or board of the control device (such as a control device for a glow plug or glow plugs of a diesel engine).

These and other objects, advantages, purposes and features of the present invention will become apparent upon review of the following specification in conjunction with the drawings.

BRIEF DESCRIPTION OF THE DRAWINGS

FIG. 1A is a side perspective view of an electrical connector portion of a glow plug control device, having a thermal protection element in accordance with the present invention;

FIG. 14A is a schematic of a SMD element with four contact nodes having a TO 220 geometry, with a possible footprint shown and with the SMD element having the function of an independent double diode, and with the TO 220 having a distance 'b' of about 17.78 mm;

FIG. 14B is a schematic of a SMD element with four contact nodes having a SOT-143 geometry, with a possible footprint shown and with the SMD element having the function of an independent double diode;

LEGEND

Figure 1B:
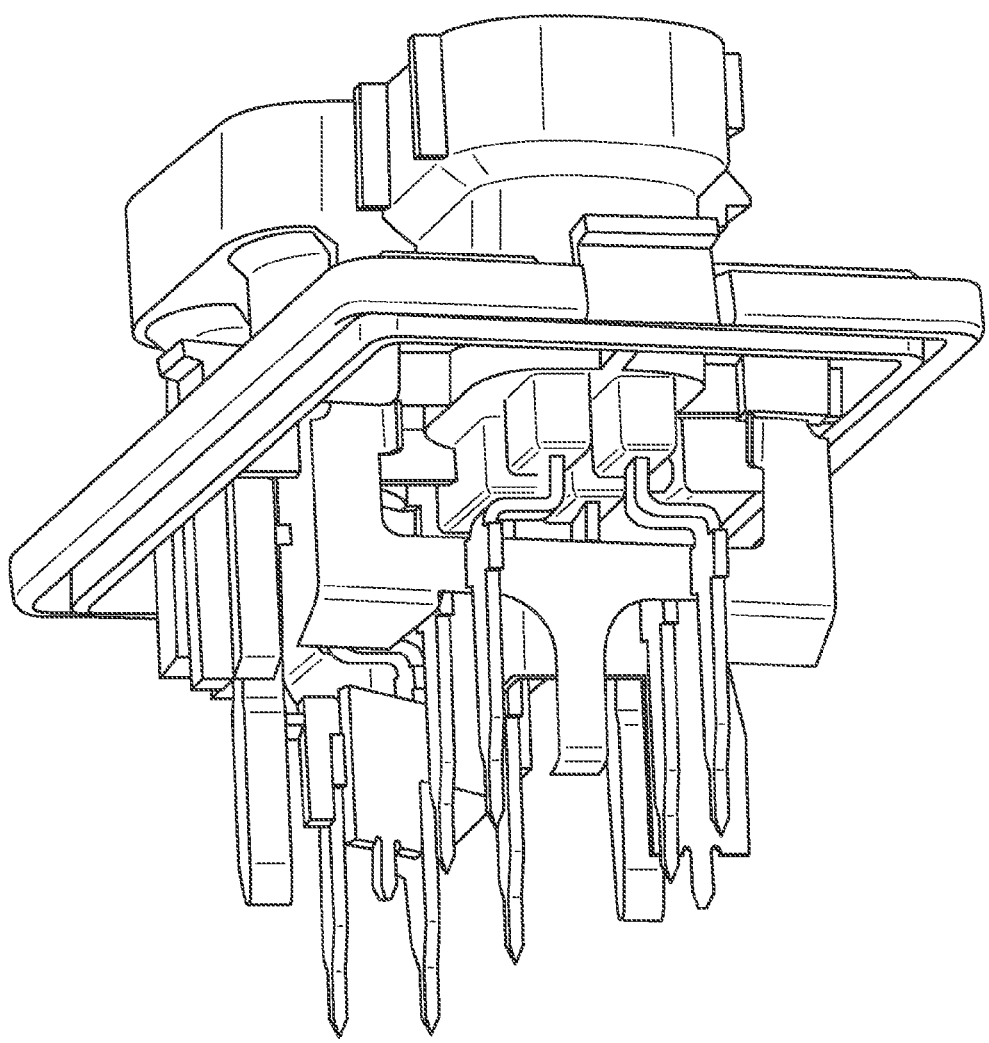
FIG. 1B is another perspective view of the electrical connector portion of FIG. 1A.
Figure 2A:
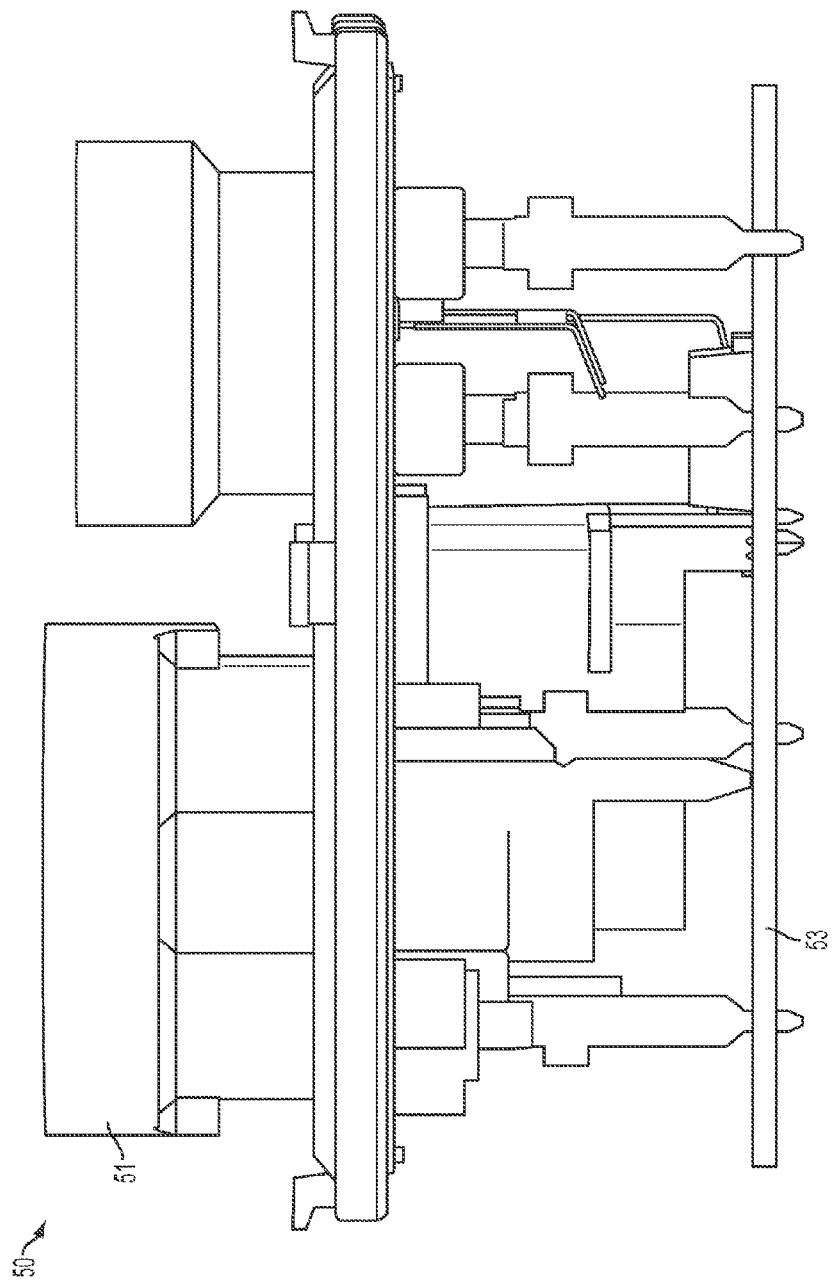
FIG. 2A is a side perspective view of the electrical connector portion of FIG. 1A, shown attached to a printed circuit board.
Figure 2B:
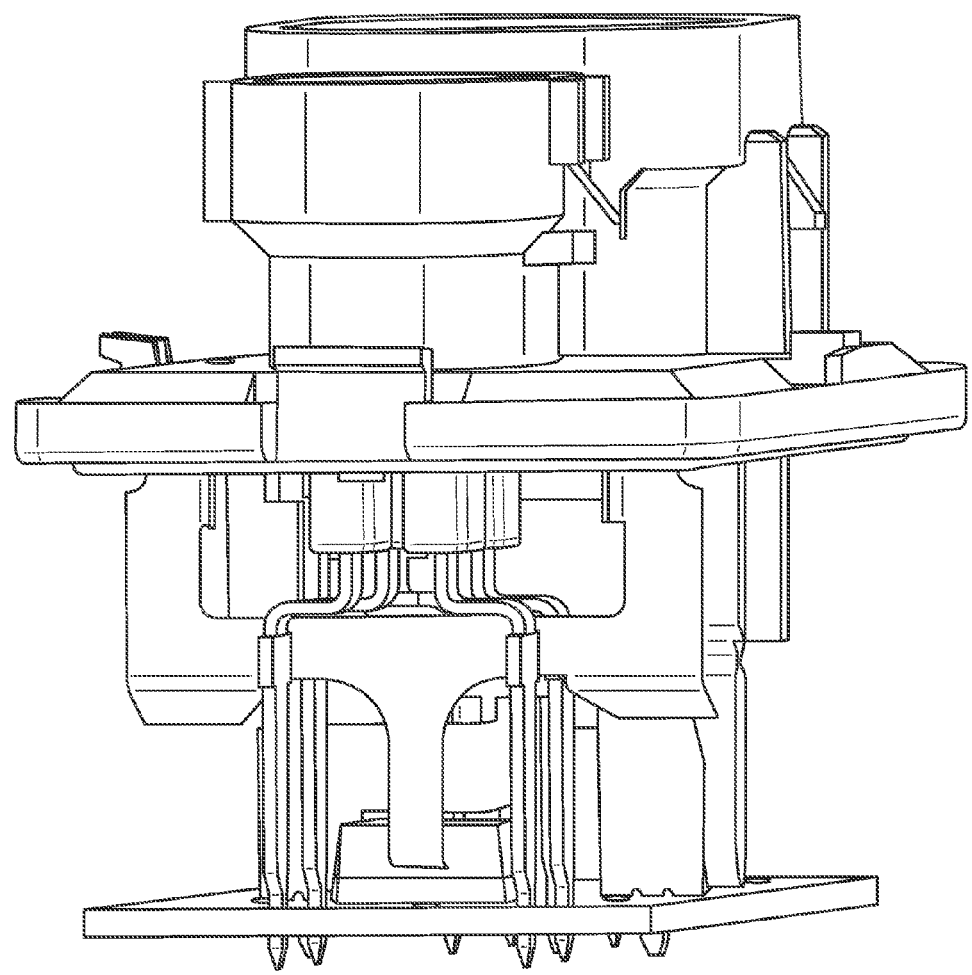
FIG. 2B is another perspective view of the electrical connector portion of FIG. 1B, shown attached to the printed circuit board.
Figure 3:
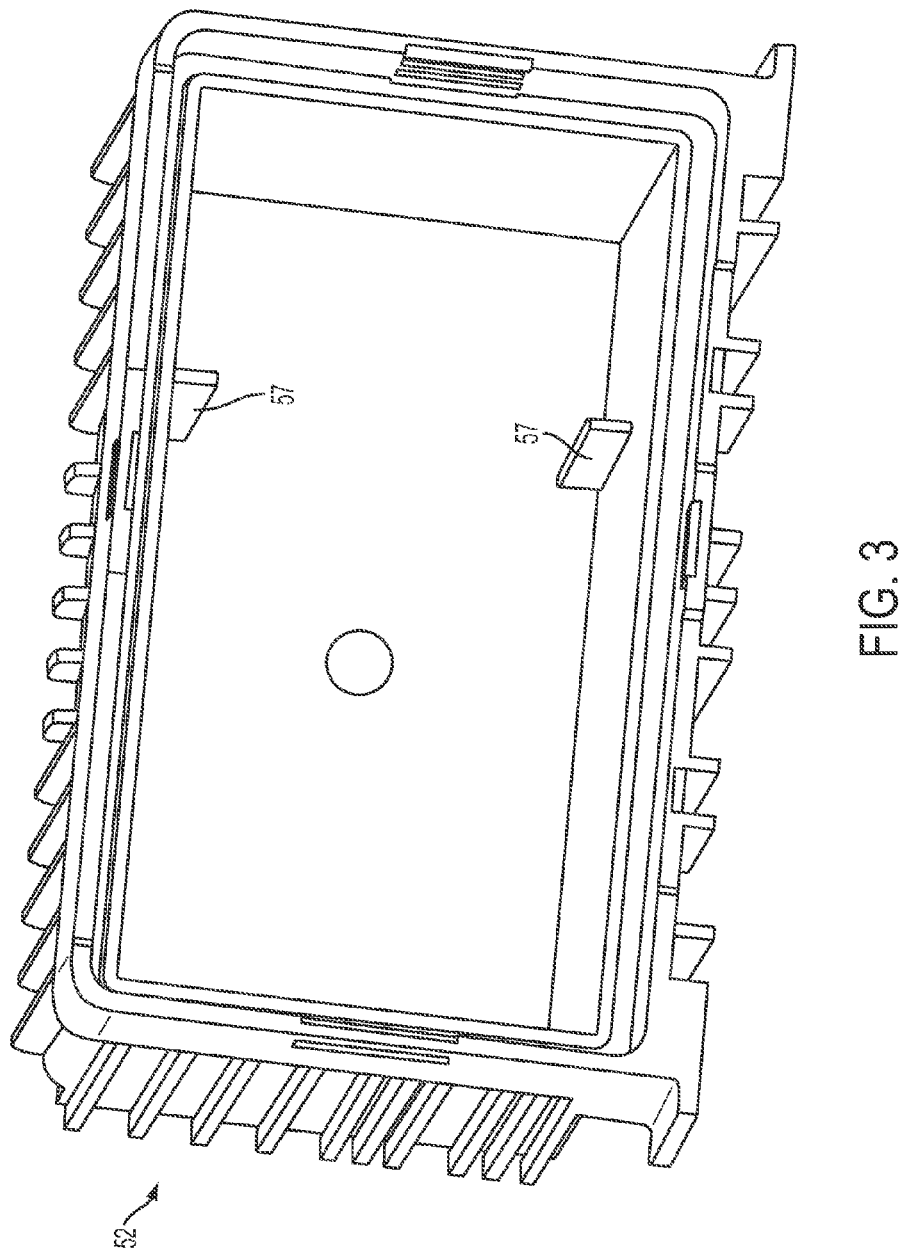
FIG. 3 is a perspective view of a housing of the glow plug control device of the present invention.

50 Glow plug control unit with thermal fuse
51 Basic connector structures
52 Housing structure
53 Printed circuit board (PCB)
54 Spring element 55 flap (stamped) on spring element 54 for spring loading during housing insertion
56 Spring loaded finger on spring element 54 at SMD 60
57 Shoulder in housing structure for spring loading spring element flaps 55
58 Electrical conducting terminals
59 Sealing structure
60 Surface mounted device (SMD) soldered to PCB 53
61 Conductor
62 Non conducting Area
63 Down holder

DESCRIPTION OF THE PREFERRED EMBODIMENTS

In diesel engine applications having a single fuse, if the main power line becomes broken by one single fuse, then after the fuse is gone, all of the glow plugs are out of function. If that should happen, then the engine may not be startable.

In diesel engine applications where each power line has its own fuse, such an arrangement allows the user to start the engine even though one fuse might be blown since the other cylinders are still heatable. However, more fuses cost more and take up more space.

The present invention provides preloaded springs that function to urge or move a device or element at the circuit board (such as a metal-oxide-semiconductor field-effect transistor or MOS-FET or other element or device of the circuit) when the circuit heats to a point where the solder holding the device or element at the circuit board becomes fluid. As soon as the solder becomes fluid, the spring load pushes or moves the device or element relative to the circuit board and out of contact with the conducting portion or contact portion of the circuit board, which breaks the current. Optionally, the present invention may utilize aspects of the control devices described in U.S. patent application Ser. No. 13/887,724, filed May 6, 2013 and published Nov. 14, 2013 as U.S. Publication No. US-2013-0298866, which is hereby incorporated herein by reference in its entirety.

Figure 4:
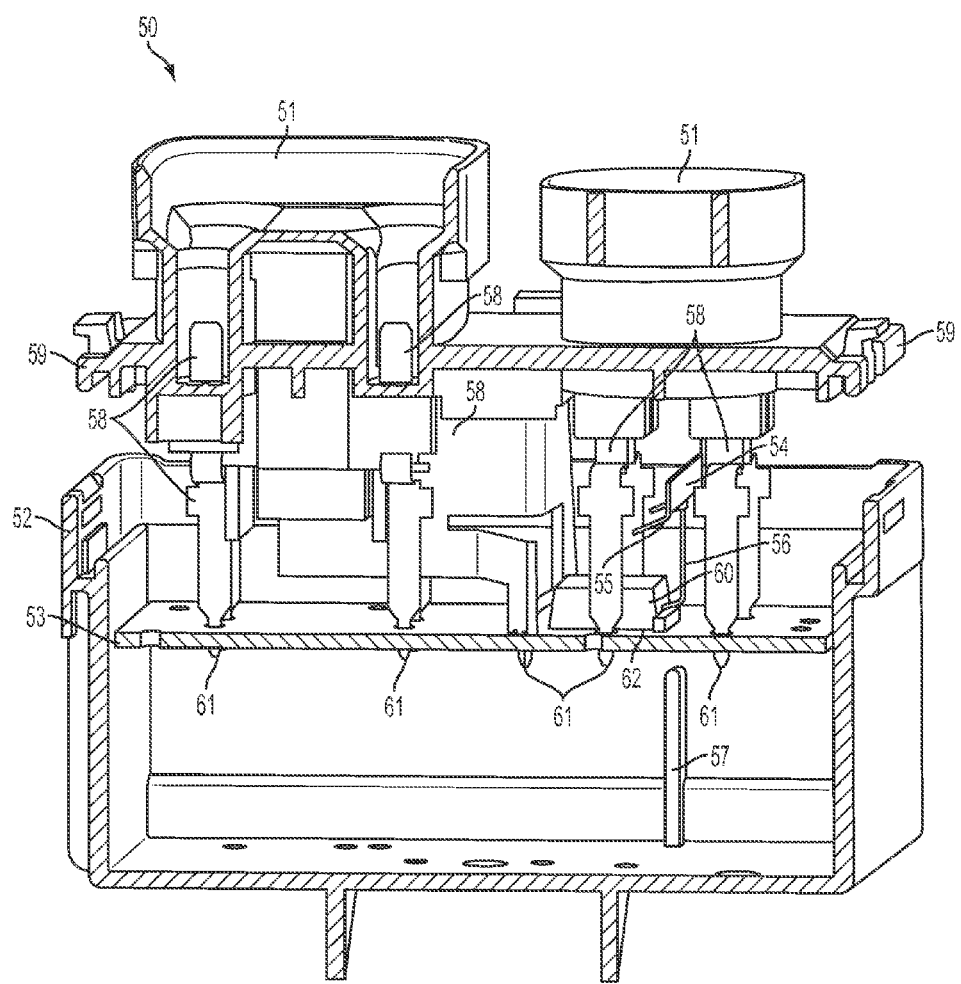
FIG. 4 is a side perspective view of the electrical connector portion and printed circuit board of FIG. 2A, shown as it is inserted partially into the housing, with the spring element in an untensioned condition.
Figure 5:
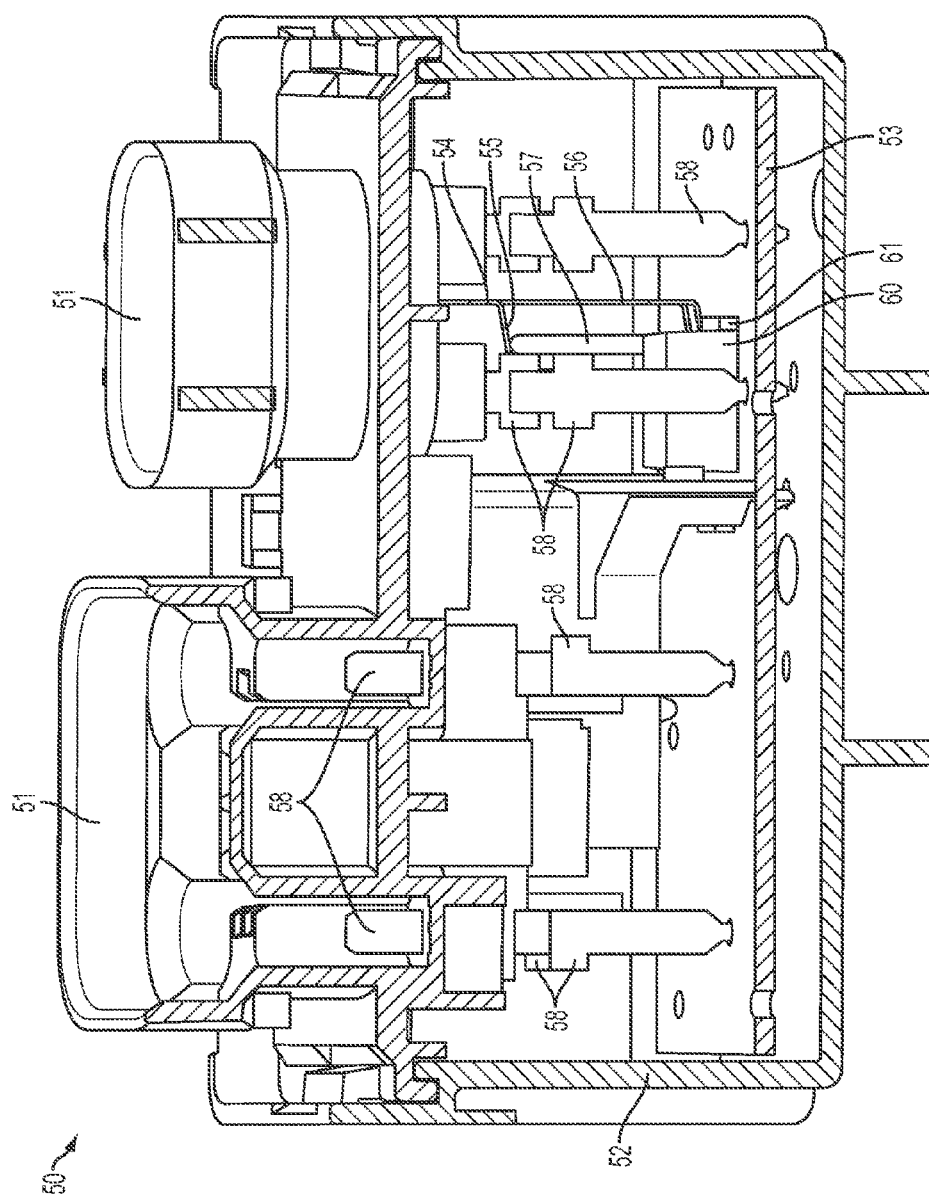
FIG. 5 is another side perspective view of the electrical connector portion and printed circuit board and housing of FIG. 4, shown with the circuit board and connector portion attached at the housing, with the spring element in a tensioned condition.
Figure 6:
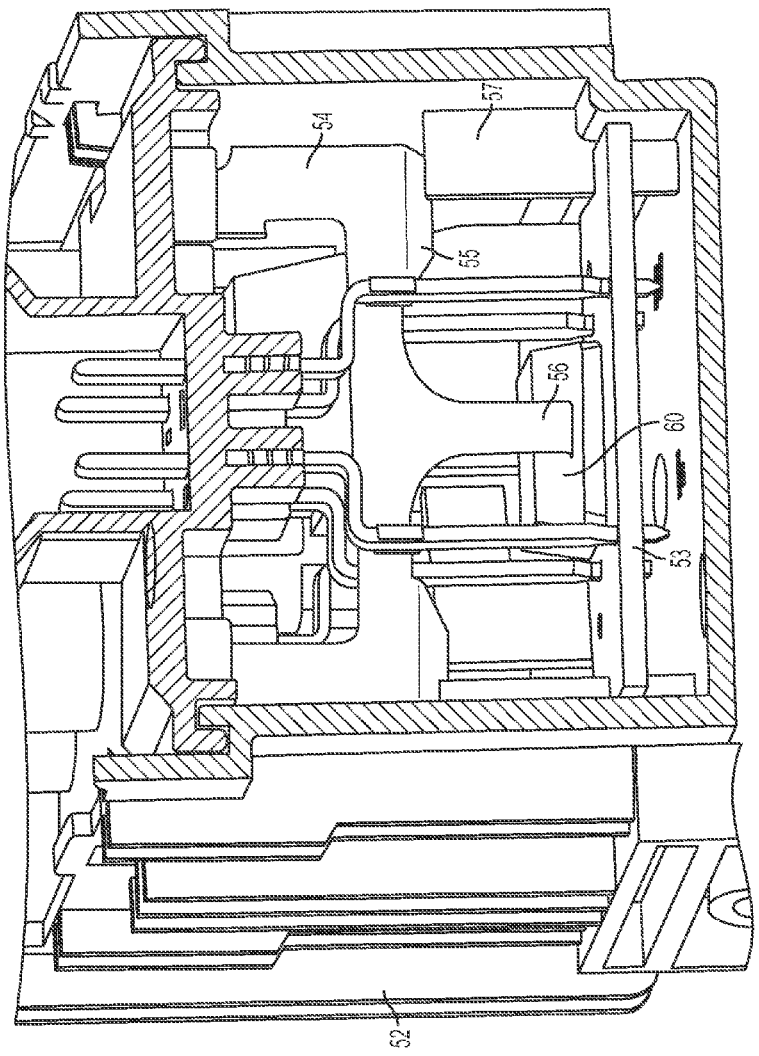
FIG. 6 is another perspective view of the control device of FIG. 5.
Figure 7:
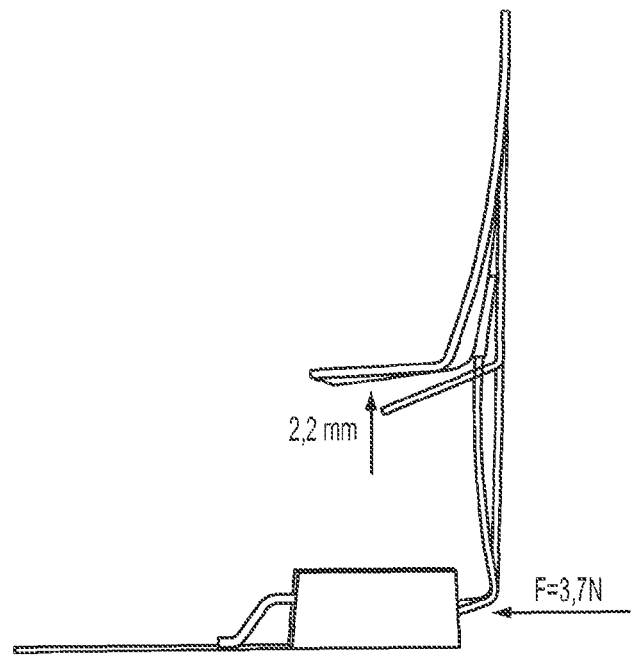
FIG. 7 is a side view of the thermal protection element or spring as it is engaged with an SMD and preloaded during assembly of the control device.
Figure 8:
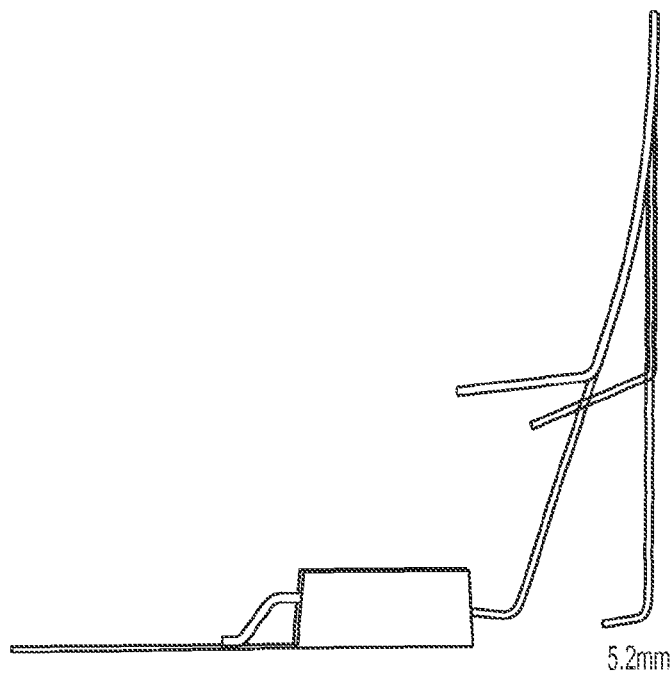
FIG. 8 is a side view similar to FIG. 7, showing the movement of the SMD by the spring when the solder at the SMD becomes fluid.
Figure 9:
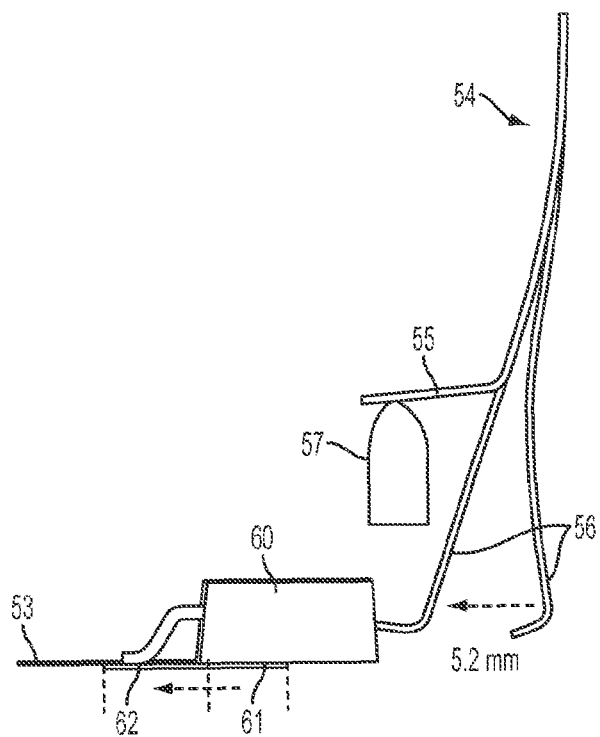
FIG. 9 is another side view of the spring, showing the SMD moving from a conducting location to a non-conducting location when the solder at the SMD becomes fluid.
Figure 10:
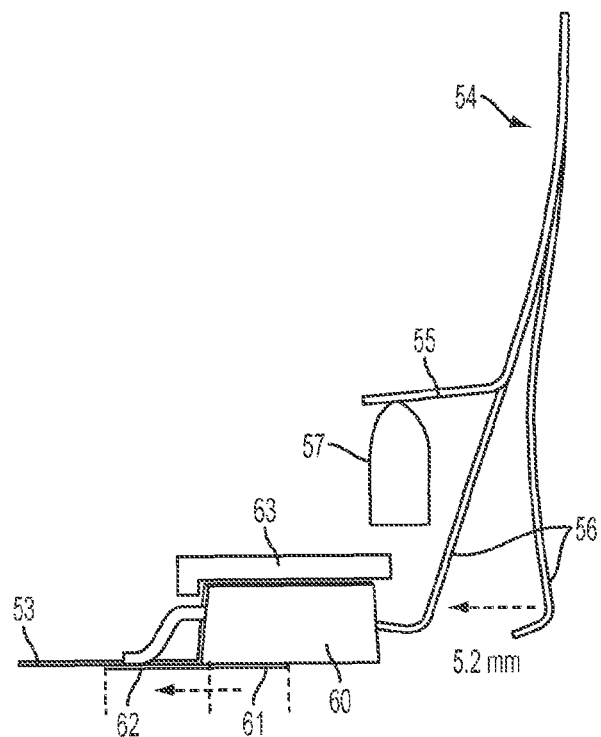
FIG. 10 is another side view similar to FIG. 9, showing an optional down holder element that holds the SMD at the circuit board and resists movement of the SMD.

As shown in FIGS. 1A-6, a glow plug control unit or device 50 has a thermal fuse that breaks the electrical connection or current flow at a circuit of a printed circuit board 53 when the temperature at the circuit is sufficient to melt or liquefy the solder that holds a surface mounted device or element 60 at the circuit board. The control unit 50 includes a connector portion 51 and a housing structure 53. The connector portion 51 comprises any suitable electrical connectors (such as multi-pin plug and socket type connectors or the like). The connector portion has a plurality of electrical conducting terminals 58 protruding from the connectors for electrically connecting at circuitry or conductors 61 of the circuit board 53. As can be seen with reference to FIGS. 2A and 2B, the terminals are attached or soldered at the circuit board before the circuit board is inserted into the housing structure. As shown in FIGS. 4 and 5, the circuit board 53 is received in the housing 52 and a sealing structure 59 seals the connector portion 51 at the housing to seal the circuitry therein.

Figure 13:
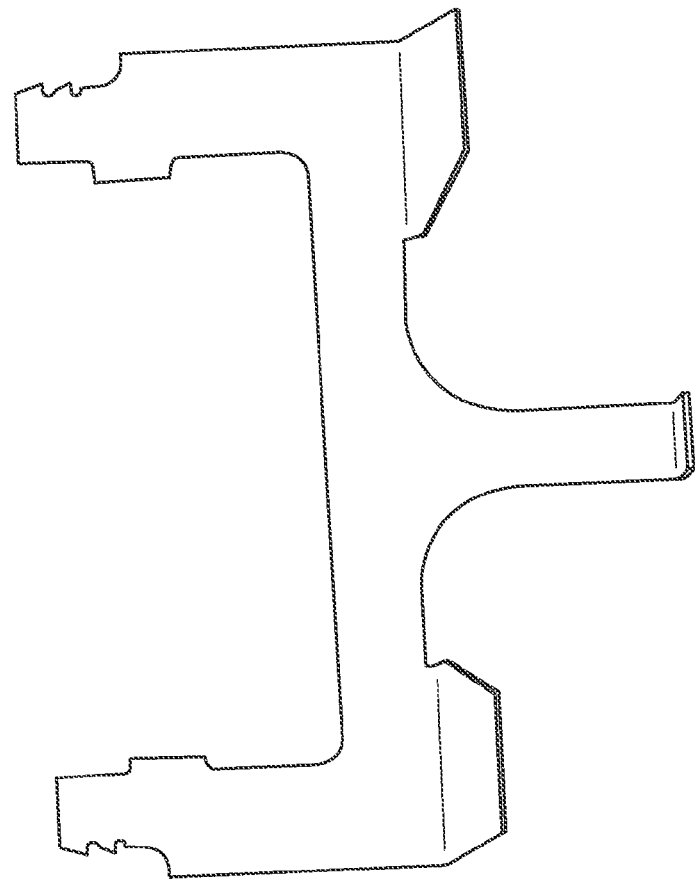
FIGS. 12 and 13 are views of the spring of the present invention.
Figure 12:
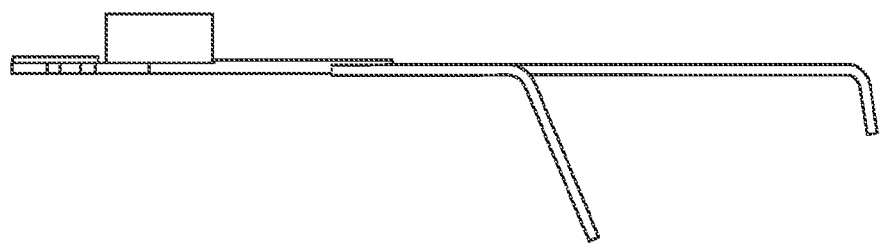

The glow plug control unit or device 50 includes a spring element 54 that may be attached at the connector portion 51 and that extends towards the circuit board 53 and engages a surface mounted device or element (SMD) 60, which is soldered at a conductor or conducting area 61 of the circuit board 53. The spring element 54 comprises a stamped metallic element, but could be made in any suitable manner and out of any suitable material, such as a stainless steel material or a spring steel material (such as, for example, an X10CrNi18-8, material number 1.4310, surface 2H (rust resistant) material or for example a Ck75, material number 1.1248, surface zinc plated (acc. film rust formation) material) that has upper ends or attachments or spikes (FIGS. 12 and 13) that are attached at or inserted in respective portions of the connector portion. As can be seen with reference to FIGS. 12 and 13, the top spikes may be formed to insert into slots of the plastic connector body, with small angled tabs or wings that serve as press shoulders and that engage the connector body when the tabs or spikes are fully seated in the connector body. Optionally, the spring element may be insert molded in the connector body or may be otherwise attached at the connector body. The spring element includes a spring loaded tab or finger that extends towards the circuit board 53 and engages the SMD 60. A pair of flaps or tabs 55 are formed at the spring element and at side regions thereof for engaging a structure or shoulder or element 57 at the housing structure 52 for loading or spring loading the spring element 54 during assembly of the device.

As can be seen with reference to FIGS. 4-10, as the connector portion 51 is attached at the housing portion or structure 52, the circuit board 53 is received in the housing structure 52 and, as the circuit board is fully received in the housing structure and the sealing portion 59 approaches and seats and seals against the lip or edge of the housing structure, the shoulders 57 engage the tabs or flaps 55 of the spring element 54, whereby the spring element 54 flexes and a pre-load or spring load is established at the finger or tab 56. Thus, the finger or tab 56 of the spring element 54 is biased or urged against the SMD 60 that it was initially disposed at or engaged with.

During operation of the control device, if the temperature in the circuit is elevated to a threshold level, the solder may begin to soften or melt or liquefy. For example, common leaded solders used for circuitry attachments typically melt at or above around 180 degrees C. (such as 182 degrees C. or thereabouts), and RoHS compliant electronic solders (such as tin-silver-copper lead-free solders) typically require a threshold temperature of at least around 217 degrees C. When the temperature in or at the circuit is elevated to such a threshold level (or above such a threshold level), and the solder that holds the SMD 60 at the respective conductor 61 of the circuit board 53 softens or melts or weakens a sufficient amount, the spring loaded finger or tab 56 (which is applying a force against the SMD 60) functions to move or slide the SMD 60 relative to the circuit board 53 to move or slide the SMD electrical contacts to a non-conducting region 62 of the circuit board, thereby breaking the circuit to prevent further overheating of the device and limiting damage to the glow plug or other controlled device that is controlled by control device 50.

Thus, the present invention provides a thermal protection system that includes a stamped metallic spring element, which can be installed into various housings and connector portions for devices that may use a horizontal PCB. When the terminals of the connector portion are soldered onto the PCB, the spring element engages one of the SMDs on the circuit board (such as a transistor or any suitable electrically conducting element). The housing structure of the device includes shoulders or tabs (FIG. 3) and the PCB may have slots or recesses or fitting cuts formed at its sides or may be dimensioned to be only as wide as the dimension of the gap between the shoulders, so that the shoulders can pass by or through the PCB as the device is assembled.

As the device is assembled (by inserting the circuit board into the housing structure in the generally vertical mounting direction shown in FIGS. 4 and 5), the shoulders engage and load the flat spring by engaging and moving the flaps of the spring and without any additional work processes or tooling. The engagement of the shoulders with the spring tabs move the tabs and flex the spring to achieve the desired preloading of the spring against the SMD. For example, and with reference to FIGS. 7-11, the shoulders may move the tabs about 2 mm (such as, for example, about 2.2 mm), which may flex the spring element to achieve about a 3 N or 4 N (such as, for example, about 3.7 N) force at the SMD.

Figure 11:
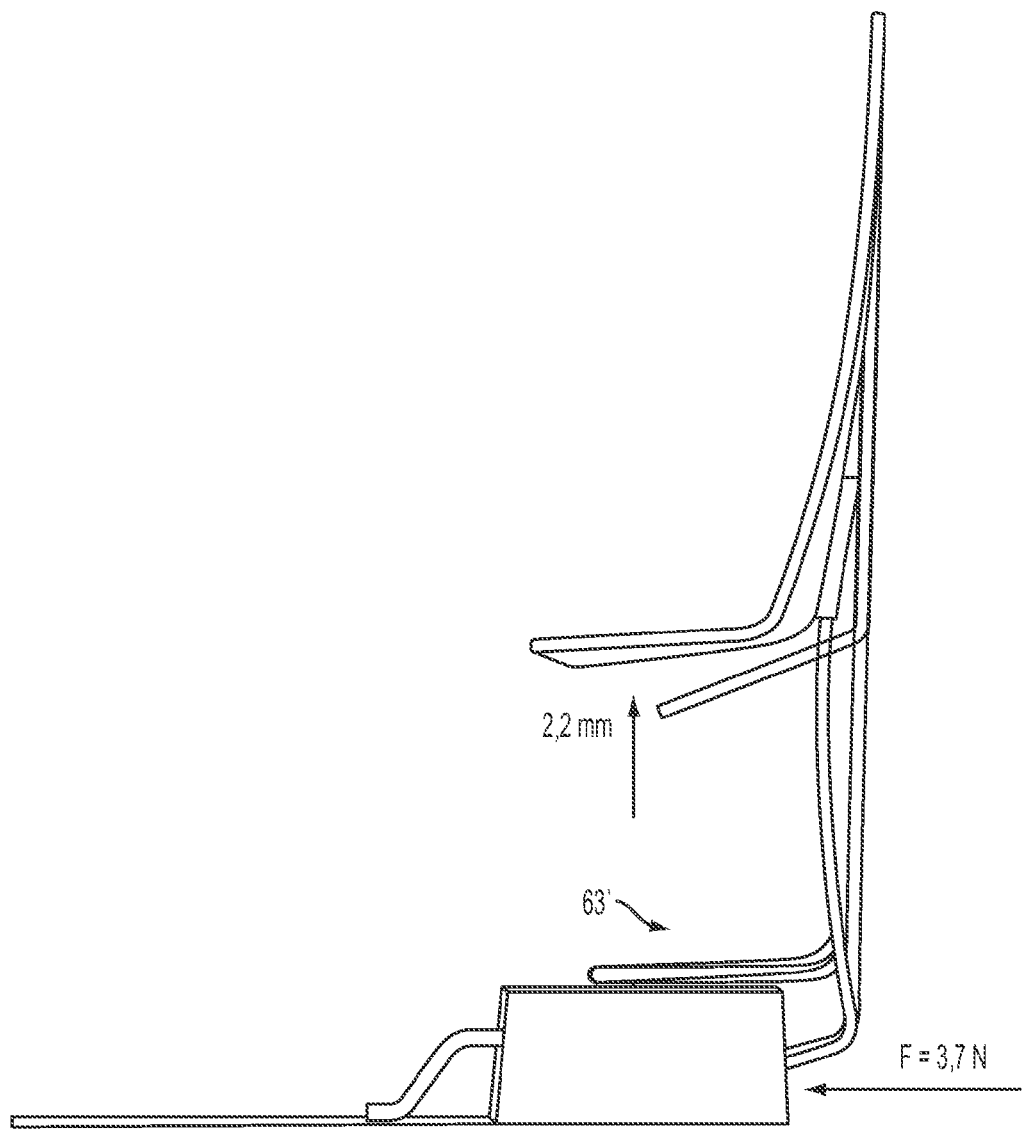
FIG. 11 is a side view of another spring of the present invention, with an integral tab that contacts the upper portion of the SMD when the control device is assembled.

In the case of a reversely applied source voltage or by a semiconductor short due to semiconductor failure, a high current will run through the circuitry of the PCB and to the connected glow plug. As soon as the solder at the PCB reaches about 180 degrees C., its minimum strength is compromised, and the SMD is shifted off of the conductor of the PCB by the inner spring load of the flat spring element finger or tab. In the illustrated embodiment of FIGS. 8-10, the tab may move the SMD about 5 mm relative to the PCB (such as, for example, about 5.2 mm), which may correspond to the distance 'd' in FIGS. 16A and 16B. In so doing, the SMD conductive connection to the PCB is broken and the current flow is broken. Optionally, a down holder 63 may be provided at the SMD to allow the SMD to move laterally along or across the PCB but to limit movement of the SMD away from the PCB, so that when the solder joint is broken and the SMD is electrically disconnected from the PCB, the SMD will not fall off of the PCB or otherwise move away from the PCB. The down holder or retaining element may be separate from the spring element and may comprise part of the housing of the control device or may comprise an element attached at the circuit board at or near the SMD element. Optionally, and as shown in FIG. 11, the spring element may include an additional tab 63' that extends over the top of the SMD to substantially limit movement of the SMD away from the PCB after the solder joint is broken and the SMD is electrically disconnected from the PCB. The spring element's range of movement or flexing (that moves the SMD element the distance 'd') as the spring element moves or flexes towards its full untensioned state may be selected such that the movement of the SMD element is greater than the pads' lengths 'c' and less than the distance 'a' in FIG. 14A or may be less than a distance between the pad at which a contact of the SMD element is attached and another electrically conducting region or pad of the circuit board (such that, when moved, the SMD element's contacts no longer electrically connect to electrically conducting regions or pads at the circuit board).

During operation, when the power terminal or node of the device is connected to a power source, such as 12 volts power source, such as the vehicle ignition power source, and when the circuitry of the PCB is heated above a threshold temperature (such as may occur during overheating of a respective transistor or circuit element), the solder around the electrical contact of the SMD may become fluid (when heated sufficiently so as to melt the solder), and as soon as the solder becomes fluid, the spring load or bias of the spring element moves the SMD contact out of contact with the conductor of the PCB (due to the biasing of the spring element towards its initial state or shape relative to the tabs or wings), which breaks the current or electrical connection at that element.

Thus, the present invention provides glow plug control device that has a spring element that functions to disconnect or break an electrical connection between a circuit element and the circuit board when the circuitry is overheating. Thus, the present invention provides a spring element that is readily added to the control device and preloaded during assembly of the device and with no additional soldering or processing or manufacturing steps, and that applies a small force at the respective SMD that does not affect the SMD unless that particular SMD overheats or heats above a threshold temperature. In order to limit the SMD element from falling off after it is disconnected, the spring may include an additional tab or tabs or wings or a slot structure at the housing or other structure or element of the connector portion (and optionally molded therewith) may be provided to hold the SMD element.

Optionally, the SMD element may comprise a semiconductor element, such as a transistor or diode, which may have an additional function than serving as conducting bridge. For example, the SMD semiconductor element may function as polarity protection diode (such as a IDB09E120 with TO-220 package, such as shown in FIG. 14A).

Optionally, the SMD element may comprise a resistor, such as a shunt which may have an additional function than serving as conducting bridge. For example, the SMD resistor element may function as a shunt which is used for current measurement under use of a measurement circuit.

Optionally, the SMD element may bridge more than one contact. For example, there may be four pads (such as a SOT-143, such as shown in FIG. 14B) on the PCB which may be bridged by two non-interconnected areas of conducting material on the SMD element (such as like a BAS-28 SMT Double Diode). Both bridges may break when all electrical contact of the SMD may become fluid (when heated sufficiently so as to melt the solder), and as soon as the solder becomes fluid, the spring load or bias of the spring element moves the SMD contact out of contact, so off the contact of two of the PCB pads (such as by shifting the circuit element laterally when using a footprint such as in FIG. 14B). As another example, the footprint of the SMD element may have three pads such as a BAW56 double diode with a SOT-23 housing, where both contact areas are broken when the pin 3 loses contact.

Figure 15:
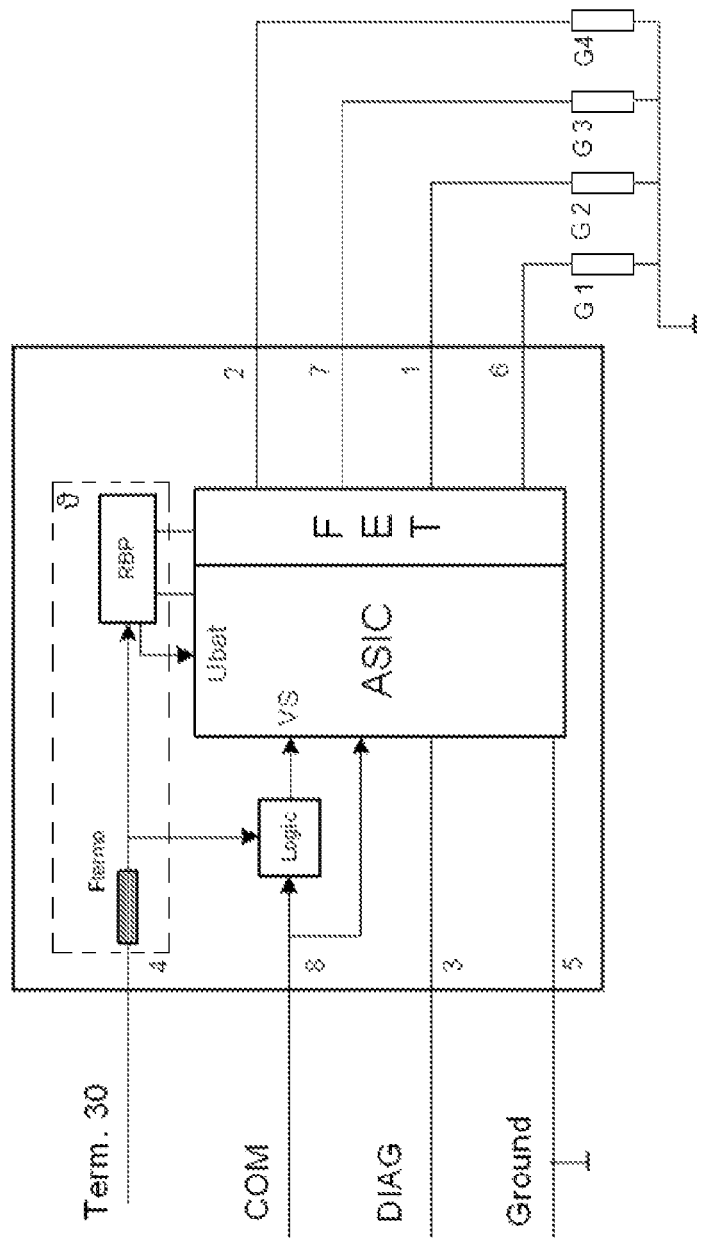
FIG. 15 is a schematic of a circuit using a single diode as a SMD element.
Figure 16A:
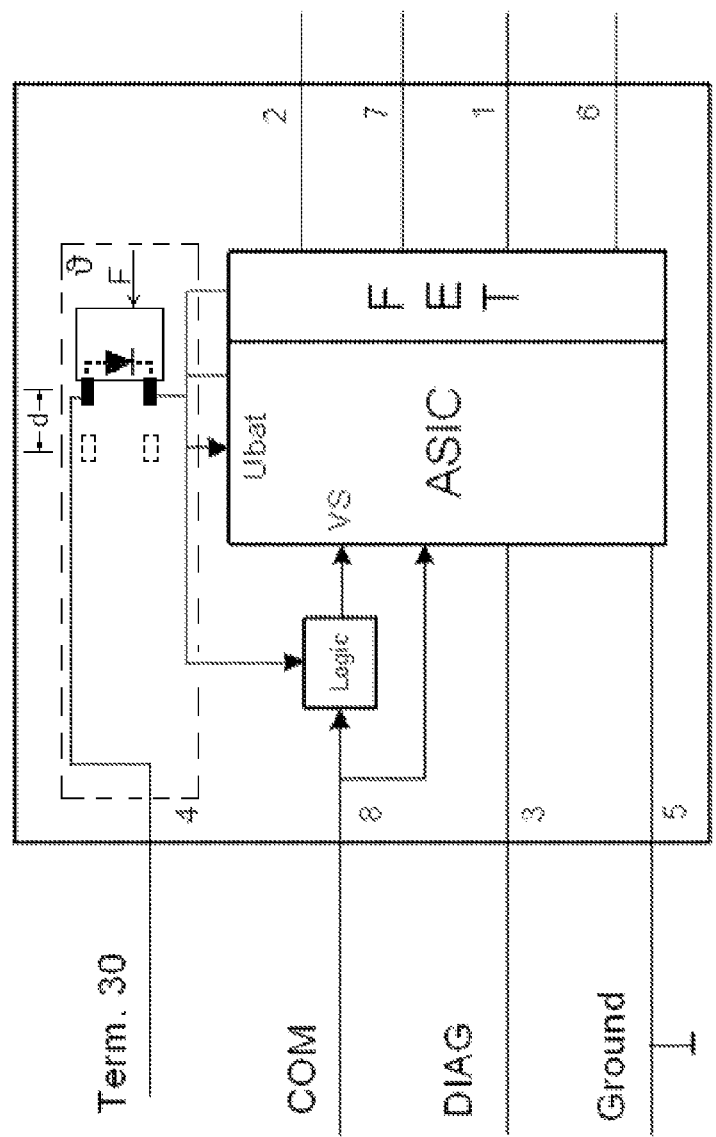
FIG. 16A is a schematic of a circuit using a diode with the contacts biased or urged away from the diode by the force 'F' of the spring element so that the element may travel the distance 'd' when the solder is sufficiently heated or softened or melted.
Figure 16B:
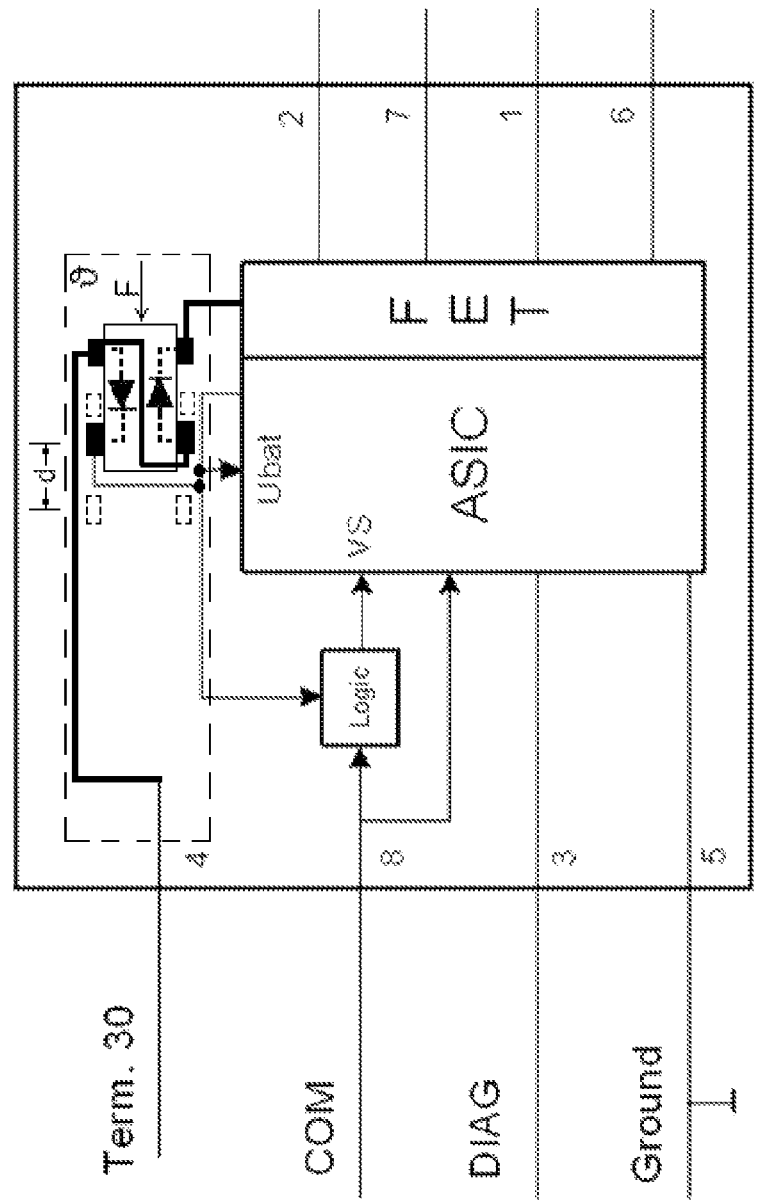
FIG. 16B is a schematic of a circuit using a double diode with two pairs of contacts biased or urged away from the diode by the force 'F' of the spring element so that the element may travel the distance 'd' when the solder is sufficiently heated or softened or melted.

Thus, and such as shown in FIG. 15, a circuit for powering glow plugs G1-4 may comprise control logic, an application specific integrated circuit (ASIC) and FET, as discussed above, and may include an SMD element that is movable via a biasing element or spring element to electrically disengage or electrically disconnect the element from the electrical contacts or pads on the circuit board when the solder at the contacts or pads is sufficiently heated and softened or melted, such as in the manner discussed above. Optionally, and such as shown in FIG. 16A, the circuit may comprise a type TO220-SMD circuit, with a single diode as the SMD element (or optionally, such as shown in FIG. 16B, the circuit may comprise a type SOT-143-SMD circuit, with a double diode as the SMD element), with the SMD element biased or urged in a direction along the circuit board, such as by the spring element applying a biasing force in the direction of the arrow 'F', whereby, when the solder at the contacts or pads is sufficiently heated and softened or melted, the spring element moves the SMD element along the circuit board via the force 'F' and may move the SMD element the distance 'd' to electrically disconnect or disengage the SMD element contacts with the circuit board contacts or pads, thereby effectively shutting down the circuit element or control circuit to limit or substantially preclude overheating of the glow plugs.

Optionally, the presence or absence of the conducting SMD element may be sensed by an adequate circuit, such as one or more connected positive signal (~25V . . . 6V) sensitive processor pin(s). When the absence and by that a failure condition of the glow plug control device is sensed, optionally a glow plug controller inherent processing device or an processing device at the outside which is connected via a wire harness to the sensing SMD element detects the failure condition and optionally the nature of that failure. Optionally, the processing device may then report/generate a failure message (such as, for example, a message communicated via a CAN or LIN network bus of a vehicle), which then may be processed by the vehicle's diagnostic system, which may lead to a user message being displayed at the on board diagnostics (OBD) or any other display device. The user or driver then may be able to repair his or her vehicle by changing a defective glow plug control unit since it is pluggable or connectable without the need of using sophisticated tools in a workshop.

Because the spring element of the present invention is not electrically connected to the circuitry, the spring element of the present invention does not become used as a heat conducting or current conducting element or device. Thus, no additional resistance is caused by the addition of the spring element at the circuit board. The spring element of the present invention thus has no effect on the electrical function of the control device and is less expensive to use and implement than conventional copper-alloys that serve as heat and current conductors.

The thermal fuse or spring element of the present invention provides a safety function against high power dissipation losses in glow plug control devices (and optionally other control devices), and is capable to be used in various housing types, such as with horizontal PCBs or the like. Optionally, the spring element of the present invention may be used in drawer or rack like housings, such as by having the side flaps for spring activation or preloading formed at an alternative angle or even generally flat relative to the PCB surface.

The spring element is independent from the soldering and reflow process, since it is married during the later final assembly. Thus, no lead free soldering is required, and no fixation of the spring is required during reflow (such as is typically required for prior art thermal fuse mounting processes). The spring element may be mounted by the basic structure or connector supplier and may be mounted by insert molding or the like, such as may be done with the terminals. Thus, no additional assembly steps are needed and no extra part handling is required to implement the spring of the present invention.

Changes and modifications to the specifically described embodiments may be carried out without departing from the principles of the present invention, which is intended to be limited only by the scope of the appended claims as interpreted according to the principles of patent law.

The invention claimed is:

1. A control device suitable for use in a vehicle, said control device comprising:
   a circuit board having a circuit element electrically connected thereat;
   a spring element engaged with said circuit element and biased to exert a force at said circuit element in a direction generally parallel to a surface of said circuit board;
   wherein said circuit element is electrically connected at said circuit board via a solder joint; and
   wherein, when a temperature at said solder joint exceeds a threshold temperature, said spring element moves said circuit element along the surface of said circuit board to break the electrical connection at said solder joint;
   wherein said spring element is biased during assembly of said control device; and
   wherein said spring element includes an engaging tab that engages said circuit element and at least one biasing tab that engages a portion of a housing of said control device during assembly of said control device, and wherein, when said at least one biasing tab engages the portion of said housing during assembly of said control device, said spring element flexes so that said engaging tab exerts a force at said circuit element.

2. The control device of claim 1, wherein, when the temperature at said solder joint exceeds a threshold temperature, said spring element moves said circuit element along the surface of said circuit board from a conducting region of said circuit board to a non-conducting region of said circuit board.

3. The control device of claim 1, wherein said spring element comprises a metallic spring element.

4. A control device suitable for use in a vehicle, said control device comprising:
   a circuit board having a circuit element electrically connected thereat;
   a storing element engaged with said circuit element and biased to exert a force at said circuit element in a direction generally parallel to a surface of said circuit board;
   wherein said circuit element is electrically connected at said circuit board via a solder joint; and
   wherein, when a temperature at said solder joint exceeds a threshold temperature, said storing element moves said circuit element along the surface of said circuit board to break the electrical connection at said solder joint; and
   wherein said control device comprises a glow plug control device for controlling at least one glow plug of a diesel engine of a vehicle.

5. A control device suitable for use in a vehicle, said control device comprising:
   a circuit board having a circuit element electrically connected thereat;
   a storing element engaged with said circuit element and biased to exert a force at said circuit element in a direction generally parallel to a surface of said circuit board;
   wherein said circuit element is electrically connected at said circuit board via a solder joint; and
   wherein, when a temperature at said solder joint exceeds a threshold temperature, said spring element moves said circuit element along the surface of said circuit board to break the electrical connection at said solder joint; and
   wherein said circuit element comprises one of (i) a diode and (ii) a resistor.

6. A control device suitable for use in a vehicle, said control device comprising:
   a circuit board having a circuit element electrically connected thereat;
   a spring element engaged with said circuit element and biased to exert a force at said circuit element in a direction generally parallel to a surface of said circuit board;
   wherein said circuit element is electrically connected at said circuit board via a solder joint; and
   wherein, when a temperature at said solder joint exceeds a threshold temperature, said spring element moves said circuit element along the surface of said circuit board to break the electrical connection at said solder joint; and wherein a control is electrically connected to at least one of the nodes of said circuit element and wherein said control is operable to generate a signal responsive to breaking of said electrical connection at said solder joint.

7. A control device suitable for use in a vehicle, said control device comprising:
- a circuit board having a circuit element electrically connected thereat;
- a spring element engaged with said circuit element and biased to exert a force at said circuit element in a direction generally parallel to a surface of said circuit board;
- wherein said circuit element is electrically connected at said circuit board via a solder joint; and
- wherein, when a temperature at said solder joint exceeds a threshold temperature, said spring element moves said circuit element along the surface of said circuit board to break the electrical connection at said solder joint; and
- wherein said spring element engages said circuit element at a non-electrically conducting portion of said circuit element.

8. The control device of claim 7, wherein said spring element is not electrically connected to circuitry of said control device.

9. The control device of claim 7, wherein said spring element is biased during assembly of said control device.

10. A control device suitable for use in a vehicle, said control device comprising:
- a circuit board having a circuit element electrically connected thereat;
- a spring element engaged with said circuit element and biased to exert a force at said circuit element in a direction generally parallel to a surface of said circuit board;
- wherein said circuit element is electrically connected at said circuit board via a solder joint; and
- wherein, when a temperature at said solder joint exceeds a threshold temperature, said spring element moves said circuit element along the surface of said circuit board to break the electrical connection at said solder joint; and
- comprising a retaining element at said circuit element, wherein said retaining element limits movement of said circuit element away from said circuit board and allows movement of said circuit element along the surface of said circuit board.

11. The control device of claim 10, wherein said retaining element is part of said spring element.

12. A control device suitable for use in a vehicle, said control device comprising:
- a circuit board having a circuit element electrically connected thereat;
- a spring element engaged with a non-electrically conducting portion of said circuit element and urged towards said circuit element to exert a force at said circuit element in a direction generally parallel to a surface of said circuit board;
- wherein said spring element comprises a metallic spring element and wherein said spring element is not electrically connected to circuitry of said control device;
- wherein said circuit element is electrically connected at an electrically conducting region of said circuit board via a solder joint; and
- wherein, when a temperature at said solder joint exceeds a threshold temperature, said spring element moves said circuit element along the surface of said circuit board from said electrically conducting region of said circuit board to a non-electrically conducting region of said circuit board to break the electrical connection at said solder joint.

13. The control device of claim 12, wherein said spring element is urged towards said circuit element during assembly of said control device.

14. The control device of claim 13, wherein said spring element includes an engaging tab that engages said circuit element and at least one biasing tab that engages a portion of a housing of said control device during assembly of said control device, and wherein, when said at least one biasing tab engages the portion of said housing during assembly of said control device, said spring element flexes so that said engaging tab exerts a force at said circuit element.

15. The control device of claim 12, wherein said control device comprises a glow plug control device for controlling at least one glow plug of a diesel engine of a vehicle.

16. A control device suitable for use in a vehicle, said control device comprising:
- a circuit board having a circuit element electrically connected thereat;
- a spring element engaged with said circuit element and biased towards said circuit element to exert a force at said circuit element in a direction generally parallel to a surface of said circuit board;
- wherein said circuit element is electrically connected at said circuit board via a solder joint;
- a retaining element at said circuit element, wherein said retaining element limits movement of said circuit element away from said circuit board and allows movement of said circuit element along the surface of said circuit board; and
- wherein, when the temperature at said solder joint exceeds a threshold temperature, said spring element moves said circuit element along the surface of said circuit board from a conducting region of said circuit board to a non-conducting region of said circuit board to break the electrical connection at said solder joint.

17. The control device of claim 16, wherein said retaining element is part of said spring element.

18. The control device of claim 16, wherein said control device comprises a glow plug control device for controlling at least one glow plug of a diesel engine of a vehicle.

19. The control device of claim 16, wherein said spring element comprises a metallic spring element, and wherein said spring element engages said circuit element at a non-electrically conducting portion of said circuit element, and wherein said spring element is not electrically connected to circuitry of said control device.

* * * * *

UNITED STATES PATENT AND TRADEMARK OFFICE
CERTIFICATE OF CORRECTION

PATENT NO. : 9,476,398 B2  
APPLICATION NO. : 14/290026  
DATED : October 25, 2016  
INVENTOR(S) : Biegert Page 1 of 1

It is certified that error appears in the above-identified patent and that said Letters Patent is hereby corrected as shown below:

Column 8  
Line 24, "storing" should be --spring--  
Line 31, "storing" should be --spring--  
Line 43, "storing" should be --spring--

Signed and Sealed this  
Twenty-fifth Day of April, 2017

Michelle K. Lee  
*Director of the United States Patent and Trademark Office*